(12) United States Patent
Jin

(10) Patent No.: US 7,786,811 B2
(45) Date of Patent: Aug. 31, 2010

(54) PHASE LOCKED LOOP WITH ADAPTIVE FILTER FOR DCO SYNCHRONIZATION

(75) Inventor: Gary Q. Jin, Kanata (CA)

(73) Assignee: Zarlink Semiconductor Inc., Kanata, ON (CA)

( * ) Notice: Subject to any disclaimer, the term of this patent is extended or adjusted under 35 U.S.C. 154(b) by 28 days.

(21) Appl. No.: 12/332,553

(22) Filed: Dec. 11, 2008

(65) Prior Publication Data
US 2009/0174490 A1 Jul. 9, 2009

(30) Foreign Application Priority Data
Jan. 8, 2008 (GB) ................. 0800251.1

(51) Int. Cl.
*H03L 7/08* (2006.01)
*H03L 7/085* (2006.01)
*H03L 7/093* (2006.01)

(52) U.S. Cl. .................... 331/17; 331/1 A; 331/16; 331/25

(58) Field of Classification Search ............. 331/1 A, 331/8, 16–18, 25, 34; 327/156–159; 332/127; 360/51; 375/376; 455/260
See application file for complete search history.

(56) References Cited

U.S. PATENT DOCUMENTS 5,956,379 A 9/1999 Tarleton
6,046,645 A 4/2000 Cucchi et al.
6,404,363 B1 6/2002 Park et al.
6,696,886 B1 2/2004 Ke et al.
7,145,399 B2 * 12/2006 Staszewski et al. ........... 331/17
2004/0202271 A1 10/2004 Fahim

FOREIGN PATENT DOCUMENTS

EP 0660526 A3 6/1995
GB 2317280 A 3/1998
WO 98/40991 A1 9/1998

* cited by examiner

*Primary Examiner*—David Mis
(74) *Attorney, Agent, or Firm*—Marks & Clerk; Richard J. Mitchell

(57) ABSTRACT

A digital phase locked loop has a digital controlled oscillator, a feedback loop coupled to the output of said digital controlled oscillator, a phase detector for comparing a feedback signal from said feedback loop with a reference signal to produce a phase error signal, and a low pass filter for filtering the phase error signal for controlling said digital controlled oscillator. A bandwidth calculation unit calculates the required filter bandwidth based on the phase error. The bandwidth calculation unit then controls the bandwidth of said low pass filter, which is thus adaptively adjusted in accordance with the phase error.

12 Claims, 3 Drawing Sheets

PHASE LOCKED LOOP WITH ADAPTIVE FILTER FOR DCO SYNCHRONIZATION

FIELD OF INVENTION

This invention relates to the field of clock synchronization, and in particular to a phase locked loop (PLL) that permits a local clock to be locked to a desired reference clock.

BACKGROUND OF THE INVENTION

There are many applications in the telecommunications field where a local clock must be synchronized to some external reference clock. This operation is typically performed with a phase locked loop.

A traditional PLL is shown in FIG. 1. In this example, the output frequency is generated by voltage controlled oscillator (VCO) 10 and fed back through a divider-by-N 16 to one input of phase detector 18, which has a second input receiving a reference clock from digital controlled oscillator (DCO) 20. The phase detector 18 obtains the phase difference between the VCO output, after division by N, where N is an integer, and the output of the DC) 20. The output of the phase detector 18, after passing through an analog low pass filter 12, is used to control the VCO 10.

The output of the phase detector 18 is a pulse with level of either −1, 0 or 1. The width of the pulse equals the time between two rising edges of the DCO output and VCO output (after division). The divisor N represents the frequency ratio between the DCO 20 and VCO 10. If the rising edge of the DCO earlier than the VCO pulse, the output of the phase detector 18 has a positive pulse. If it arrives later, the output is a negative pulse. If two rising edges arrive at the same time, the output is zero.

The DCO 20 is locked to a primary reference source as shown in FIG. 2 and forms part of a digital PLL including a divider-by-M 22, a subtractor 26 for deriving the phase difference between the feedback signal and the reference source, and a digital low pass filter 24. The output of the DC) 20 is a pulse which is produced whenever the DCO counter value reaches a predetermined threshold. The DCO outputs complete phase information or the whole DCO value. As in FIG. 1, the divider M represents the frequency ratio between DCO and reference signal.

Subtractor 26 compares the DCO phase with the input reference phase, and the resulting phase error is filtered by digital low pass filter 24 and used to adjust the frequency of the DCO 20.

The DCO frequencies $f_{DCO}$ (FIG. 1) and $f_{DCO1}$ (FIG. 2) can be the same value or can be a scaled difference.

Since the DCO 20 is locked to the primary reference source and the VCO 10 is locked to the DCO 20, it follows that the VCO is also locked to the primary reference source. The quality of the frequency lock is measured as measured by jitter (short term variations) and wander (long term variations). The digital filter shown in FIG. 2 is a very important element in the reduction of phase error. For a small amount of jitter, say less than 1 ps, the filter should have a very small bandwidth, typically less than 1 Hz. However, the use of such a low bandwidth filter means that it will take a very long time to acquire frequency lock.

Prior art implementations are also complex and not well suited for circuit integration.

SUMMARY OF THE INVENTION

In accordance with the principles of the invention, the phase locked loop includes a digital filter that can be adaptively adjusted depending on the phase error. This makes it possible to achieve final lock error with a small amount of jitter in a relatively short time.

According to a first aspect of the invention there is provided a digital phase locked loop comprising a digital controlled oscillator; a feedback loop coupled to the output of said digital controlled oscillator and having a bandwidth B; a phase detector for comparing a feedback signal from said feedback loop with a reference signal to produce a phase error signal to control the digital controlled oscillator; a $1^{st}$ order IIR low pass filter for filtering the phase error signal controlling; and a bandwidth calculation unit coupled to the low pass filter for calculating the required filter bandwidth B in accordance with the expression $$B = \left\lceil \frac{E}{p} \right\rceil \cdot C,$$

where E is the phase error and p is a constant, to adaptively adjust the bandwidth of the low pass filter in accordance with the phase error.

A phase locked loop in accordance with embodiments of the invention will accommodate both the frequency acquisition and the jitter performance. It also requires smaller number of bits for the data and memory with the same frequency lock precision and dynamic range, and avoids a phase error jump when occasional spiking noise causes phase error out of the range.

In a further aspect the invention provides a method of controlling a digital phase locked loop including a digital controlled oscillator comprising comparing an output of said digital controlled oscillator with a reference signal to derive a phase error signal; filtering said phase error signal with a first order IIR low pass filter having a bandwidth B; controlling said digital controlled oscillator with said phase error signal after filtering; and adaptively adjusting the bandwidth B of said low pass filter in accordance with the expression $$B = \left\lceil \frac{E}{p} \right\rceil \cdot C,$$

where E is the phase error and p is a constant.

BRIEF DESCRIPTION OF THE DRAWINGS

The invention will now be described in more detail, by way of example only, with reference to the accompanying drawings, in which.

DETAILED DESCRIPTION OF PREFERRED EMBODIMENTS

Figure 1:
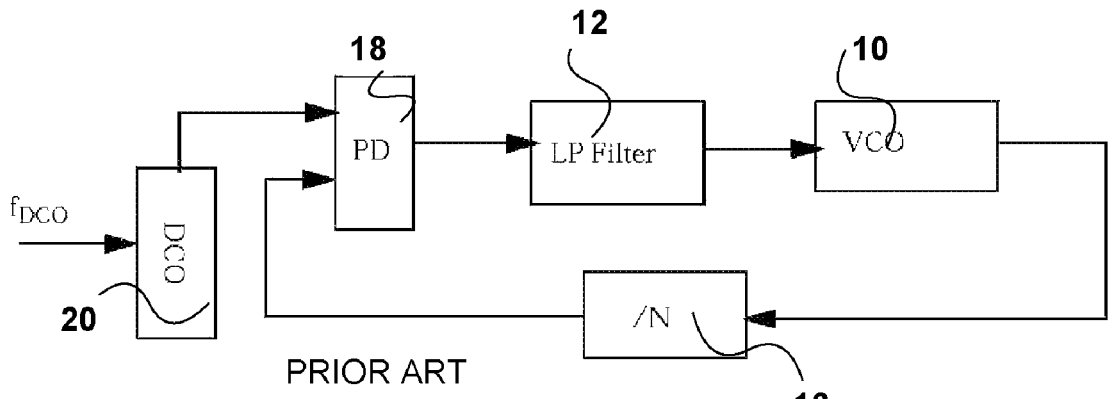
FIG. 1 is a block diagram of a prior art analog phase locked loop.
Figure 2:
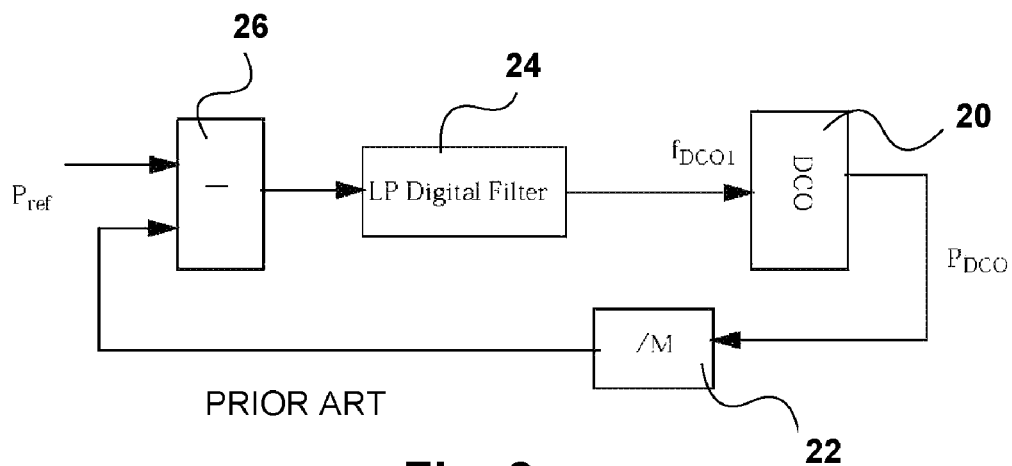
FIG. 2 is a block diagram of a digital phase locked loop with an external primary reference source providing a reference for the phase locked loop of FIG. 1.
Figure 3:
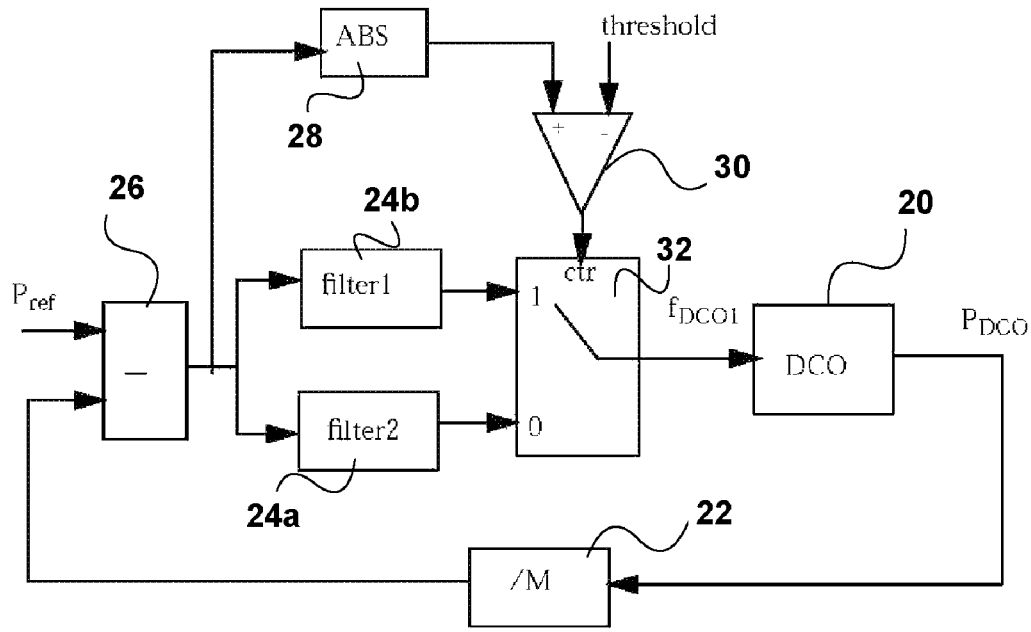
FIG. 3 is a block diagram of a phase locked loop with dual filters.

One way of addressing the problem of lock time is to employ two filters as shown in FIG. 3. In this case, the output of the phase detector is supplied to two low pass filters 24a and 24b as well as an absolute value unit 28, which provides an input to a comparator 30 having a second input receiving a threshold value. One of the filters 24a has a small bandwidth and the other 24b has a large bandwidth. The output of the comparator 30 is connected to a select input of multiplexer 32 to select one of the filters 24a, 24b for connection to the input of the DCO 20.

When the phase error detected by the subtractor 26, acting as a phase detector, is smaller than a given threshold (say 1 ps.), the output of the comparator selects the small bandwidth filter 24a is selected, and when the phase error is larger than the threshold, comparator 30 selects the large bandwidth filter 24b. Typically, the small bandwidth filter 24a has a bandwidth of less than 0.5 Hz and the large bandwidth 24b has a bandwidth of 3 to 10 Hz. A similar structure can be found in U.S. Pat. Nos. 7,242,740; and 7,126,429, the contents of which are herein incorporated by reference. In this case the filter 24b is used for the frequency acquisition and filter 24a is used for frequency tracking (after frequency is locked). In the references the two filters are actually one filter with two set of parameters.

This method however suffers from error propagation when the phase error $P_{ref}-P_{DCO}$ has a one time spike just over threshold during the tracking mode. This one time error will trigger 24b only once, but due to its large bandwidth, the filter output error will have large variation. This large variation will be transferred to the DCO output frequency, then to the DCO phase and then to the memory of filter 24a. This whole feedback loop will allow the large error to remain in the loop for a long period of time. The small bandwidth of filter 24b will let the error effect staying even longer for a small phase error that just barely passes the threshold once.

Figure 4:
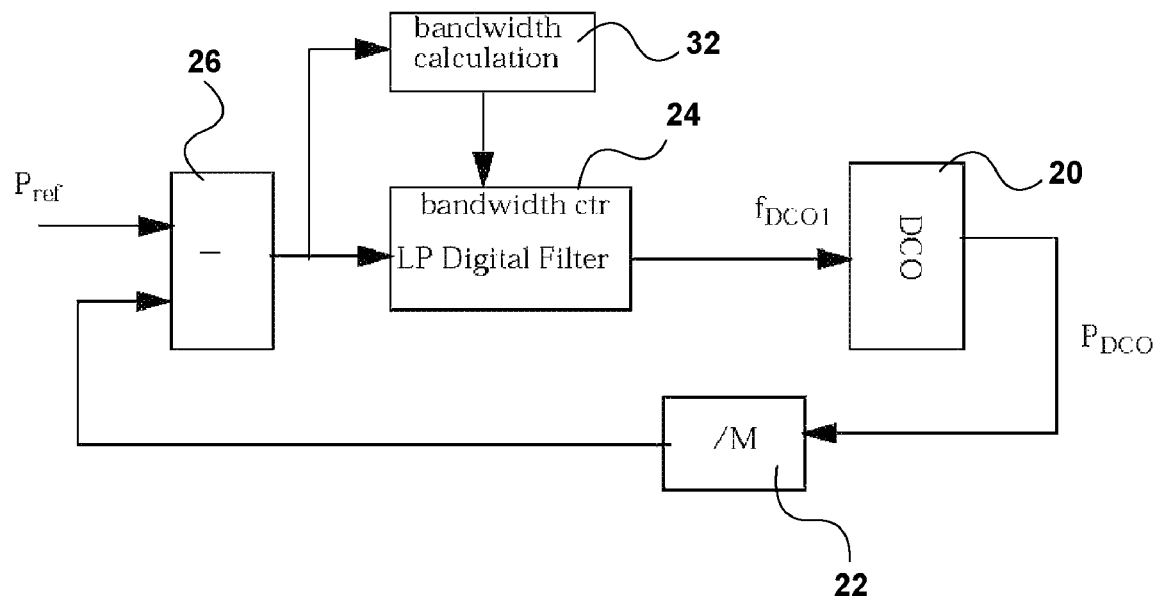
FIG. 4 is a block diagram of a phase locked loop with an adaptive filter control in accordance with an embodiment of the invention.

A phase locked loop in accordance with one embodiment of the invention is shown in FIG. 4. In this case the phase detector/subtractor 26 is connected to a low pass digital filter 24 with controllable bandwidth, which is determined by the bandwidth calculation unit 32, which may be in the form of a digital signal processor performing the calculation in software to derive the bandwidth based on the detected phase error. Alternatively, the bandwidth calculation unit can be implemented in hardware.

The bandwidth of the filter 24 is designed to increase in dependence on the detected phase error. If we assume the phase error output by the phase detector 26 in FIG. 4 is $E=|Pref-P_{DCO}|$, one suitable way of finding the bandwidth B of the filter 24 is determined in accordance with the expression $$B = \left\lceil \frac{E}{p} \right\rceil \cdot C$$

where C is the minimum acceptable bandwidth and p is a constant to control the step for filter bandwidth. The minimum acceptable bandwidth is the minimum acceptable for tracking frequency deviations. If the bandwidth is too high, the loop will include too much noise; if the bandwidth is too low, the loop will not be able to adequately track the frequency deviations.

The brackets indicate that the nearest larger integer number is used. It will be appreciated that this is only one example, and other formulae can be employed based on design considerations, the key feature being that the bandwidth of the filter is adaptively adjusted with the phase error.

Figure 5:
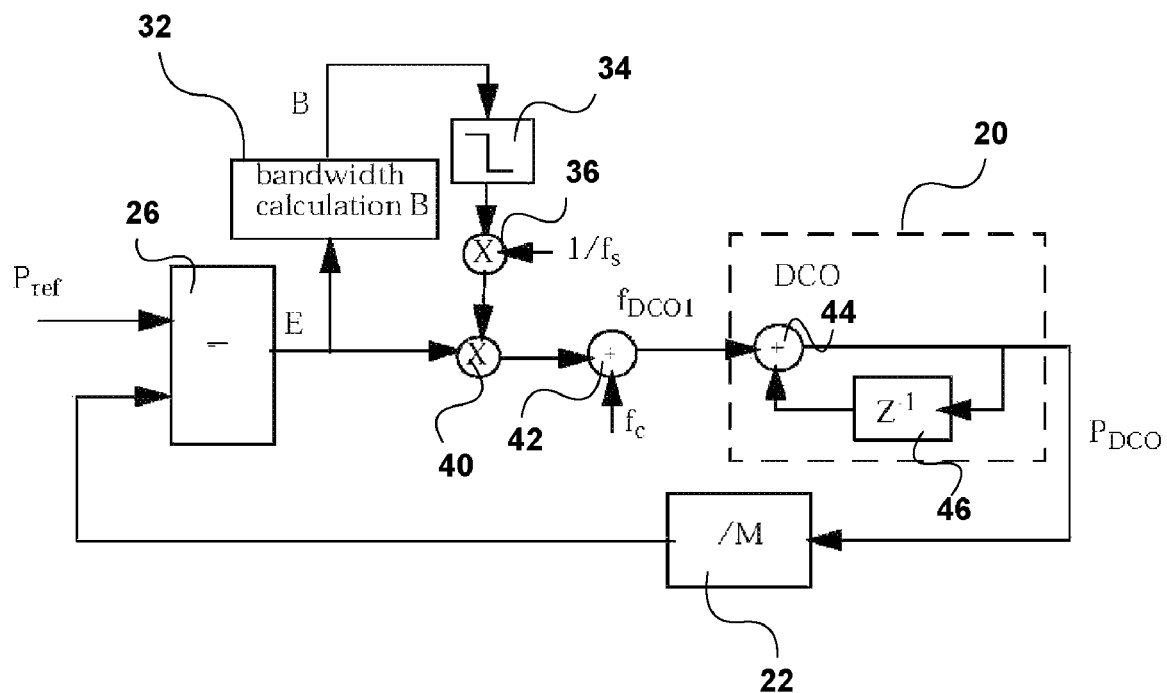
FIG. 5 is a block diagram illustrating the adaptive control of a DCO filter.

A simple way and particularly effective way of implementing the digital filter 24 is as a $1^{st}$ order IIR filter employing two multipliers. Such an implementation is shown in FIG. 5, where $f_s$ is the sampling frequency for the digital implementation and $f_c$ is the DCO center frequency. The DCO 20 is a first order phase accumulator comprising an accumulator 44 and delay 46 unit.

In FIG. 5 the output of the phase detector 26 appears as a phase error E which is input as a scaling factor to one input of multiplier 40. The output of the bandwidth calculation unit, after passing through optional limiter 34, is applied to one input of multiplier 36 whose second input is a signal $1/f_s$. The output of the multiplier 36 is applied to the second input of the multiplier 40, and thus operates to adaptively adjust the scaling factor applied to the input of the accumulator 42 in accordance with the results of the bandwidth calculation.

The limiter 34 may be needed to limit the calculated bandwidth B to lie within a certain range.

Figure 6:
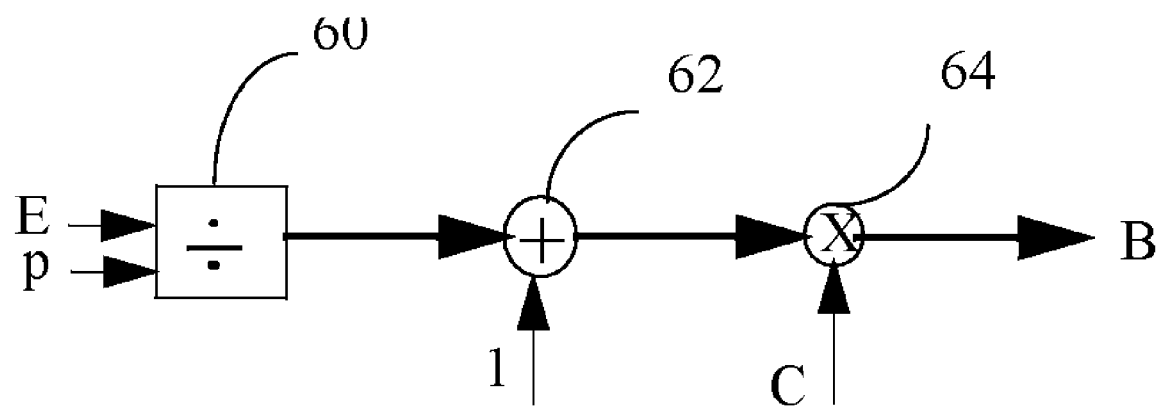
FIG. 6 is a block diagram of an exemplary bandwidth calculation unit.

FIG. 6 shows an exemplary embodiment of the bandwidth calculation circuit. The inputs E and p are fed into a divider 60, the output of which is fed to adder 62 and multiplier 64. A 1 is added to the output of the divider 60. This ensures that the bandwidth ceiling occurs after the divider. A hardware implementation provides an integer output, so the output of the divider is an integer.

Typical values for the filter bandwidth calculation is p=0.01 ps per 10 ns. period and C=0.1 Hz. The limiter could typically limit B to lie in the range of 0.1 Hz to 3 Hz.

The Bandwidth calculation can also use an accumulator or any simple or complex low pass filter based on the phase error output.

It will be appreciated that other types of low pass filter can be controlled by the bandwidth calculation unit.

An important advantage of the described implementation is that it is of very low complexity and therefore is well suited to integration for incorporation on a single chip.

The invention claimed is:

1. A digital phase locked loop comprising:
   a digital controlled oscillator;
   a feedback loop coupled to the output of said digital controlled oscillator and having a bandwidth B;
   a phase detector for comparing a feedback signal from said feedback loop with a reference signal to produce a phase error signal to control the digital controlled oscillator;
   a $1^{st}$ order IIR low pass filter for filtering the phase error signal controlling; and
   a bandwidth calculation unit coupled to the low pass filter for calculating the required filter bandwidth B in accordance with the expression $$B = \left\lceil \frac{E}{p} \right\rceil \cdot C,$$

where E is the phase error, C is the minimum acceptable bandwidth and p is a constant, to adaptively adjust the bandwidth of the low pass filter in accordance with the phase error.

2. A digital phase locked loop as claimed in claim 1, wherein the low pass filter includes a first multiplier with a first input coupled to the output of the bandwidth calculation unit and a second input receiving $1/f_s$, where $f_s$ is the sampling frequency, and a second multiplier coupled to the output of the phase detector and the output of said first multiplier, the second multiplier having an output coupled to an input of the digital controlled oscillator.

3. A digital phase locked loop as claimed in claim 2, further comprising a limiter for limiting the output of the bandwidth calculation unit applied to the first input of the first multiplier.

4. A digital phase locked loop as claimed in claim 3, wherein the output of the second multiplier is applied to a first input of an adder receiving at a second input the center frequency of the digital controlled oscillator, and the adder having an output applied to an input of the digital controlled oscillator.

5. A digital phase locked loop as claimed in claim 1, wherein the bandwidth calculation unit comprises a divider for dividing the phase error E by the constant p, and a multiplier for multiplying the result by the constant C.

6. A digital phase locked loop as claimed in claim 3, wherein said limiter limits the bandwidth to lie in the range of 0.1 Hz to 3 Hz.

7. A digital phase locked loop as claimed in claim 1, wherein p=0.01 ps per 10 ns, period and C=0.1 Hz.

8. A method of controlling a digital phase locked loop including a digital controlled oscillator comprising:
   comparing an output of said digital controlled oscillator with a reference signal to derive a phase error signal;
   filtering said phase error signal with a first order IIR low pass filter having a bandwidth B;
   controlling said digital controlled oscillator with said phase error signal after filtering;
   adaptively adjusting the bandwidth B of said low pass filter in accordance with the expression $$B = \left\lceil \frac{E}{p} \right\rceil \cdot C,$$

where E is the phase error, C is the minimum acceptable bandwidth and p is a constant.

9. A method as claimed in claim 8, wherein the output of the bandwidth calculation unit is input to the first input of a first multiplier having a second input receiving $1/f_s$, where $f_s$ is the sampling frequency, and the output of the first multiplier is input to a second multiplier coupled to the output of the phase detector and an output coupled to an input of the digital controlled oscillator.

10. A method as claimed in claim 9, further comprising limiting the calculated bandwidth to lie within a predetermined frequency range.

11. A method as claimed in claim 10, wherein said predetermined frequency range is 0.1 Hz to 3 Hz.

12. A method as claimed in claim 8, wherein p=0.01 ps per 10 ns, period and C=0.1 Hz.

* * * * *